United States Patent [19]

Sakuma et al.

[11] Patent Number: 5,262,920
[45] Date of Patent: Nov. 16, 1993

[54] THIN FILM CAPACITOR

[75] Inventors: Toshiyuki Sakuma; Shintaro Yamamichi; Shogo Matsubara, all of Tokyo, Japan

[73] Assignee: NEC Corporation, Tokyo, Japan

[21] Appl. No.: 882,000

[22] Filed: May 13, 1992

[30] Foreign Application Priority Data

May 16, 1991 [JP] Japan .................... 3-139506
Jun. 7, 1991 [JP] Japan .................... 3-162347

[51] Int. Cl.⁵ ............... H01G 4/10; H01G 1/01
[52] U.S. Cl. .................... 361/321.5; 361/305; 361/313
[58] Field of Search ........... 361/321, 311, 312, 313, 361/320, 304, 305; 29/25.42; 252/63.2, 8 T; 365/145; 357/51; 437/60

[56] References Cited

U.S. PATENT DOCUMENTS

| | | | |
|---|---|---|---|
| 3,851,228 | 11/1974 | Sheard | 361/305 |
| 4,437,139 | 3/1984 | Howard | 361/313 |
| 4,631,633 | 12/1986 | Shaulov | 361/321 |
| 4,733,328 | 3/1988 | Blazej | 361/320 |
| 5,005,102 | 4/1991 | Larson | 361/313 |
| 5,122,477 | 6/1992 | Wolters et al. | 437/60 |

FOREIGN PATENT DOCUMENTS

3-80562   4/1991  Japan .
3-101260  4/1991  Japan .

OTHER PUBLICATIONS

"Barrier Layers for Realization of High Capacitance Density in SrTiO₃ Thin-Film Capacitor on Silicon", Applied Physics Letters, 57 (23), 3 Dec. 1990, Toshiyuki Sakuma et al., pp. 2431-2433.

"RF Sputtered Strontium Titanate Films", IBM Journal of Res. Development, W. B. Pennebaker, Nov. 1969, pp. 686-695.

*Primary Examiner*—Bruce A. Reynolds
*Assistant Examiner*—Michael D. Switzer
*Attorney, Agent, or Firm*—Burns, Doane, Swecker & Mathis

[57] ABSTRACT

In a thin film capacitor in which a lower electrode, a dielectric film and an upper electrode are formed in order on a substrate, both the lower and upper electrodes are respectively formed with a first conductive layer made of Ti, Ta, Mo and W and a second conductive layer made of Pt, Pd, Rh and Al in this order from the substrate. In addition, a conductive metal oxide film such as made of PdO and others is formed, as required, at least between the lower electrode and the dielectric film or between the upper electrode and the dielectric film.

12 Claims, 1 Drawing Sheet

THIN FILM CAPACITOR

BACKGROUND OF THE INVENTION

1. Field of the Invention

The present invention relates to a thin film capacitor and, more particularly, a thin film capacitor formed on a semiconductor substrate.

2. Description of the Prior Art

Conventionally, as this type of thin film capacitor, a construction in which a dielectric film and an upper electrode are formed in order directly on an electrode area of a silicon substrate by a sputtering method has been disclosed on the Patent Application Laid-Open No. Hei 3-80562, hereafter referred to as Prior Art 1. Another construction in which a dielectric film and an upper electrode are formed in order on a conductive film, which comprises a first layer made of at least a type of high melting point metal such as, for example, Ta or Ti and a second layer made of at least a type of metal such as, for example, Pt or Pd on an electrode area of a silicon substrate has been disclosed on the Patent Application Laid-Open No. Hei 3-101260, hereafter referred to Prior Art 2. A further construction in which Pt or Pd is deposited as a lower electrode and a dielectric film and an upper electrode are formed in order on an insulative substrate made of sapphire or the like has been disclosed on IBM Journal of Res. Development, 68 (1969), p. 686~695, hereafter referred to as Prior Art 3.

As regards the thin film capacitors with the conventional constructions as described above, however, Prior Art 3 is disadvantageous in that, if the thin film capacitor is heat-treated after it has been made by forming a lower electrode, a dielectric film and an upper electrode in order on an insulative substrate, a reaction takes place between upper and lower electrodes and the dielectric film and consequently a leak current will increase. Prior Art 1 is disadvantageous in that, since the dielectric film is formed directly on the silicon electrode area by a sputtering method, the surface of the silicon electrode area is oxidized during formation of the dielectric film and the capacity of the thin film capacitor as a whole is limited due to silicon dioxide with a low dielectric constant which is produced on interfacial surfaces of the silicon electrode area and the dielectric film even though a dielectric film with a high dielectric constant is formed, whereas Prior Art 1 is advantageous in that the leak current is prevented from being substatially large owing to presence of the silicon dioxide layer in heat treatment after the thin film capacitor has been formed.

In case of a construction in which the first and second conductive films are formed on the silicon electrode area and the dielectric film and the upper electrode are formed thereon in order as in Prior Art 2, the capacity of the whole thin film capacitor can be enhanced while preventing formation of the layer with a low dielectric constant by an appropriate heat treatment but a leak current flowing through the dielectric film cannot be controlled, and particularly, in the case that the thickness of the dielectric film is 50 nm or less, a tunneling of the carrier is increased to enlarge the leak current. In addition, the construction in this case is also disadvantageous in that heat treatment after formation of the upper electrode will cause a reaction of the upper electrode and the dielectric film to result in an increase of leak current.

Accordingly, it is an object of the present invention which was made to solve such conventional problems to provide a thin film capacitor capable of preventing formation of a low dielectric constant layer and increasing of the leak current even after heat treatment by forming the lower and upper electrodes with at least two conductive films as the leak current characteristics may not be adversely affected due to a reaction of the electrode materials and the dielectric film.

SUMMARY OF THE INVENTION

According to the present invention, a lower electrode, a dielectric film and an upper electrode are formed in order on a substrate, and the lower electrode and the upper electrode respectively at least have a first conductive film made of at least one layer of layers of a high melting point metal such as titanium, tantalum, molybdenum, tungsten, ruthenium, ruthenium silicide, ruthenium oxide, rhenium, rhenium silicide, rhenium oxide, osmium, osumium silicide, osmium oxide, rhodium, rhodium silicide and rhodium oxide or silicide compounds of these metals and titanium nitride, which are to be arranged from the substrate side, and a second conductive film made of at least one layer of one of platinum, palladium, rhodium and aluminium and the dielectric film is made of a substance selected from $BaTiO_3$, $SrTiO_3$, $PbTiO_3$, $PbZrO_3$, $LiNbO_3$ and $Bi_4Ti_3O_{12}$ or solid solutions of these substances, thus preventing the increase of the leak current after heat treatment. In addition, a conductive metal oxide film is formed, as required, at least between the second conductive film at the lower electrode side and the dielectric film or between the first conductive film of the upper electrode side and the dielectric film, thus reducing the leak current.

DETAILED DESCRIPTION OF PREFERRED EMBODIMENTS

Figure 1:
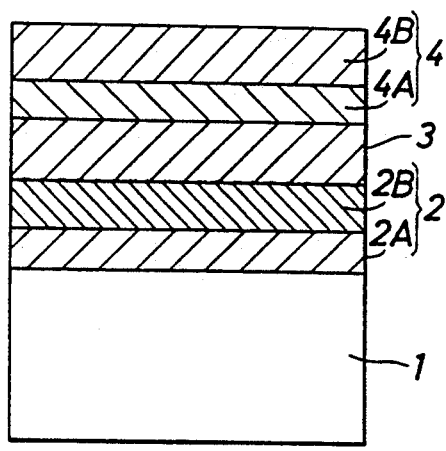
FIG. 1 is a cross sectional view showing the first embodiment of the thin film capacitor according to the present invention.

The first embodiment of the thin film capacitor according to the present invention is described below, referring to the drawings.

FIG. 1 is a cross sectional view showing the first embodiment of the thin film capacitor according to the present invention.

On a sapphire substrate 1, a lower electrode 2, a dielectric film 3 made of $SrTiO_3$ and an upper electrode 4 are consecutively formed.

The lower electrode 2 comprises a Ti (titanium) layer 2A as a first conductive film and a Pt (platinum) layer 2B as the second conductive film and the upper electrode 4 comprises a W (tungsten) layer 4A as the first conductive film and an Al (aluminium) layer 4B as the second conductive film.

In the first embodiment, $SrTi_3$ is used as the dielectric film 3 but a similar effect could be obtained by using $BaTiO_3$, $PbTiO_3$, $PbZrO_3$, $LiNbO_3$, $Bi_4Ti_3O_{12}$ or one of solid solutions of these substances. Insulative substrates other than the sapphire substrate 1 provided the similar effect.

In addition, in the first embodiment, titanium and tungsten were used as the first conductive films of the lower and upper electrodes 2 and 4 but a similar effect was obtained by using high melting point metals such as tantalum, molybdenum, ruthenium, ruthenium silicide, ruthenium oxide, rhenium, rhenium silicide, rhenium oxide, osmium, osmium silicide osmium oxide, rhodium, rhodium silicide and rhodium oxide or silicide compounds of these metals or titanium nitride as the first conductive film. Platinum and aluminium were used as the second conductive films of the lower and upper electrodes 2 and 4 but a similar effect was obtained by using palladium or rhodium.

The above described thin film capacitor of the first embodiment is manufactured as described below by a known thin film depositing technology. First, Ti (titanium) and Pt (platinum) layers 2A and 2B are deposited, as the lower electrode 2, in order in thicknesses of 10 to 150 nm and 20 to 150 nm, respectively, on the sapphire substrate 1 by the DC magnetron sputtering method, and subsequently a $SrTiO_3$ layer is deposited, as the dielectric film 3, in a thickness of 30 to 500 nm on the lower electrode 2 by the high frequency magnetron sputtering method. Finally, the tungsten and aluminium layers 4A and 4B are deposited, as the upper electrode 4, in thicknesses of 10 to 150 nm and 100 to 1200 nm, respectively, on the dielectric film 3 by the DC magnetron sputtering method.

When the thin film capacitor manufactured as described above was given a heat treatment at 400° to 500° C. for 10 to 90 minutes, the leak current did not increase. This is because reaction between the aluminum layer 4B as a part of the upper electrode 4 and the dielectric film 3 is restrained by the tungsten layer 4A.

The second embodiment of the thin film capacitor in accordance with the present invention is described referring to the drawings.

Figure 2:
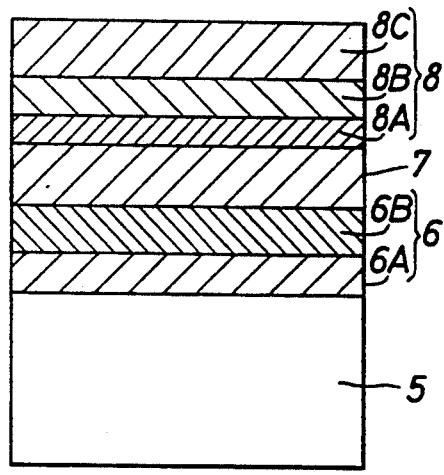
FIG. 2 is a cross sectional view showing the second embodiment of the thin film capacitor according to the present invention.

FIG. 2 is a cross sectional view showing the second embodiment of the thin film capacitor in accordance with the present invention.

On an n-type low resistance silicon substrate 5, a lower electrode 6, a dielectric film 7 of $SrTiO_3$ and an upper electrode 8 are consecutively formed.

The lower electrode 6 comprises a Ta (tantalum) layer 6A as a first conductive film and a Pt (platinum) layer 6B as a second conductive film and the upper electrode 8 comprises a Ti (titanium) layer 8A and a TiN (titanium nitride) layer 8B as a first conductive film and an Al (aluminium) layer 8C as a second conductive film.

In the second embodiment, $SrTiO_3$ was used as the dielectric film 7 but a similar effect was obtained by using $BaTiO_3$, $PbTiO_3$, $PbZrO_3$, $LiNbO_3$ and $Bi_4Ti_3O_{12}$ or solid solutions of these substances. Moreover, a similar effect was obtained by using, as the substrate 5, a p-type silicon substrate, a substrate made of Ge or a compound semiconductor of Group III-V elements of Ga, As, In, P, and Al, in addition to the n-type silicon substrate 5.

Furthermore, in the second embodiment, tantalum, titanium and titanium nitride were used as the first conductive films of the lower and upper electrodes 6 and 8 but a similar effect was obtained by using high melting point metals such as tantalum, molybdenum, tungsten, ruthenium, ruthenium silicide, ruthenium oxide, rhenium, rhenium silicide, rhenium oxide, osmium, osmium silicide, osmium oxide, rhodium, rhodium silicide and rhodium oxide or silicide compounds of these metals or titanium nitride as the first conductive films of the lower and upper electrodes 6 and 8. Platinum and aluminium were used as the second conductive films of the lower and upper electrodes 6 and 8 but a similar effect was obtained by using palladium or rhodium.

The above described thin film capacitor of the second embodiment is manufactured as described below by a known depositing technology.

First, a Ti (titanium) layer 6A and a Pt (platinum) layer 6B are deposited, as the lower electrode 6, in thicknesses of 10 to 150 nm and 20 to 150 nm, respectively, on the silicon substrate 5 by the DC magnetron sputtering method, and subsequently a $SrTiO_3$ layer is deposited, as the dielectric film 7, in a thickness of 30 to 500 nm on the lower electrode 9 by the high frequency magnetron sputtering method. Next, a Ti (titanium) layer BA, a TiN (titanium nitride) layer 8B and an Al (aluminium) layer 8C are deposited, as the upper electrode 8, in thickneesses of 10 to 150 nm, 10 to 150 nm and 100 to 1200 nm, respectively, on the dielectric film 7.

The Ti layer 8A and the Al layer 8C as the upper electrode 8 were formed by the DC magnetron sputtering method and the TiN layer 8B was formed by the reactive DC magnetron sputtering method.

When the thin film capacitor of the second embodiment thus manufactured was given a heat treatment at 400° to 500° C. for 10 to 90 minutes, the leak current did not increase.

Figure 3:
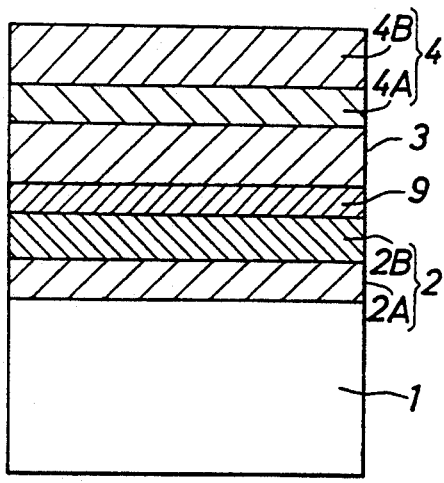
FIG. 3 is a cross sectional view showing the third embodiment of the thin film capacitor according to the present invention.

According to the above described first and second embodiments, the increase of leak current after heat treatment can be prevented. As in case of the third embodiment shown in FIG. 3, if a conductive metal oxide film 9 of PdO with a thickness of 5 to 150 nm is formed between the Pt layer 2B as the second conductive film of the lower electrode 2 side and the dielectric film 3 in the thin film capacitor shown in FIG. 1 by the reactive DC magnetron sputtering method, the increase of the leak curent can be prevented even though the thickness of the dielectric film 3 of the thin film capacitor is 50 nm or less. This is because carriers in the lower electrode 2 can be extinct by the existence of the conductive metal oxide film 9.

In the thin film capacitor of the third embodiment, the leak current can be reduced regardless of the polarity of the voltage to be applied by forming a conductive metal oxide film 9 between the W layer 4A as the first conductive film at the upper electrode 4 side and the dielectric film 3.

Figure 4:
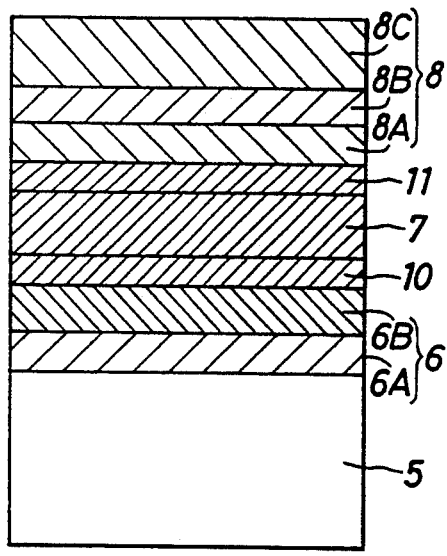
FIG. 4 is a cross sectional view showing the fourth embodiment of the thin film capacitor according to the present invention.

The thin film capacitor of the fourth embodiment shown in FIG. 4 is made up by forming, in the thin film capacitor shown in FIG. 2, PdO conductive metal oxide films 10 and 11 which respectively have a thickness of 5 to 150 nm between the Pt layer 6B as the second conductive film of the lower electrode 6 and the dielectric film 7 and between the Ti layer 8A as the first conductive film of the upper electrode 8 and the dielectric film 7.

Also in the thin film capacitor of the fourth embodiment, the increase of leak current after heat treatment can be prevented and, moreover, in case of the thin film capacitor of which the dielectric film 7 has a thickness of 50 nm or under, the increase of leak current can be prevented. Also in this case, as a matter of course, one of conductive metal oxide films 10 and 11 can be used satisfactorily.

The conductive metal oxide film can be made of conductive TaOx SrTiOx, etc. in addition to PdO.

As described above, the present invention promotes preventing the formation of a low dielectric constant layer which reduces the capacity of the thin film capacitor and an increase of the leak current resulting from reactions of the upper and lower electrodes with the dielectric film in heat treatment after the capacitor has been made and further promotes preventing an increase of the leak current even when the thickness of the dielectric film is small.

What is claimed is:

1. A thin film capacitor, comprising: a lower electrode, a dielectric film, and an upper electrode formed in order on a substrate, said lower electrode and said upper electrode respectively having at least a first conductive film made of at least one layer of a high melting point metal selected from the group consisting of titanium, tantalum, molybdenum, tungsten, ruthenium, ruthenium silicide, ruthenium oxide, rhenium, rhenium silicide, rhenium oxide, osmium, osmium silicide, osmium oxide, rhodium, rhodium silicide and rhodium oxide, silicide compounds of these metals and titanium nitride, and a second conductive film made of at least one of platinum, palladium, rhodium and aluminum, said first conductive film being arranged closer to the substrate and said second conductive film being formed above the first conductive film, said dielectric film being made of a substance selected from the group consisting of $BaTiO_3$, $SrTiO_3$, $PbTiO_3$, $PbZrO_3$, $LiNbO_3$, $Bi_4Ti_3O_{12}$, and solid solutions of these substances, wherein a conductive metal oxide film is formed between said second conductive film of said lower electrode and said dielectric film.

2. A thin film capacitor as claimed in claim 1, wherein said substrate is one of: (i) a semiconductor substrate which is impurity-doped as one of an n-type and a p-type; (ii) a substrate made of a compound of at least two elements selected from the group consisting of Ga, As, In, P and Al; and (iii) a solid solution substrate of one of Si and Ge.

3. A thin film capacitor as claimed in claim 1, wherein said substrate is a sapphire substrate.

4. A thin film capacitor as claimed in any one of claims 1, 2, or 3, wherein said conductive metal oxide film is made of PdO.

5. A thin film capacitor, comprising: a lower electrode, a dielectric film, and an upper electrode formed in order on a substrate, said lower electrode and said upper electrode respectively having at least a first conductive film made of at least one layer of a high melting point metal selected from the group consisting of titanium, tantalum, molybdenum, tungsten, ruthenium, ruthenium silicide, ruthenium oxide, rhenium, rhenium silicide, rhenium oxide, osmium, osmium silicide, osmium oxide, rhodium, rhodium silicide and rhodium oxide, silicide compounds of these metals and titanium nitride, and a second conductive film made of at least one of platinum, palladium, rhodium and aluminum, said first conductive film being arranged closer to the substrate and said second conductive film being formed above the first conductive film, said dielectric film being made of a substance selected from the group consisting of $BaTiO_3$, $SrTiO_3$, $PbTiO_3$, $PbZrO_3$, $LiNbO_3$, $Bi_4Ti_3O_{12}$, and solid solutions of these substances, wherein a conductive metal oxide film is formed between said first conductive film of said upper electrode and said dielectric film.

6. A thin film capacitor as claimed in claim 5, wherein said substrate is one of: (i) a semiconductor substrate which is impurity-doped as one of an n-type; (ii) a substrate made of a compound of at least two elements selected from the group consisting of Ga, As, In, P and Al; and (iii) a solid solution substrate of one of Si and Ge.

7. A thin film capacitor as claimed in claim 5, wherein said substrate is a sapphire substrate.

8. A thin film capacitor as claimed in any one of claims 5, 6 and 7, wherein said conductive metal oxide film is made of PdO.

9. A thin film capacitor, comprising: a lower electrode, a dielectric film, and an upper electrode formed in order on a substrate, said lower electrode and said upper electrode respectively having at least a first conductive film made of at least one layer of a high melting point metal selected from the group consisting of titanium, tantalum, molybdenum, tungsten, ruthenium, ruthenium silicide, ruthenium oxide, rhenium, rhenium silicide, rhenium oxide, osmium, osmium silicide, osmium oxide, rhodium, rhodium silicide and rhodium oxide, silicide compounds of these metals and titanium nitride, and a second conductive film made of at least one of platinum, palladium, rhodium and aluminum, said first conductive film being arranged closer to the substrate and said second conductive film being formed above the first conductive film, said dielectric film being made of a substance selected from the group consisting of $BaTiO_3$, $SrTiO_3$, $PbTiO_3$, $PbZrO_3$, $LiNbO_3$, $Bi_4Ti_3O_{12}$, and solid solutions of these substances, wherein a conductive metal oxide film is formed between said second conductive film of said lower electrode and said dielectric film, and a conductive metal oxide film is formed between said first conductive film of said upper electrode and said dielectric film.

10. A thin film capacitor as claimed in claim 9, wherein said substrate is one of : (i) a semiconductor substrate which is impurity-doped as one of an n-type and a p-type; (ii) a substrate made of a compound of at least two elements selected from the group consisting of Ga, As, In, P and Al; and (iii) a solid solution substrate of one of Si and Ge.

11. A thin film capacitor as claimed in claim 9, wherein said substrate is a sapphire substrate.

12. A thin film capacitor as claimed in any one of claims 9, 10, or 11, wherein each of the conductive metal oxide films is made of PdO.

* * * * *